United States Patent [19]

Süsz

[11] Patent Number: 4,514,773
[45] Date of Patent: Apr. 30, 1985

[54] CIRCUIT ARRANGEMENT FOR GENERATING AN ACTUATING SIGNAL FOR A PIEZO-ELECTRIC ELEMENT OF A POSITIONING DEVICE

[75] Inventor: Dietfried Süsz, Vienna, Austria

[73] Assignee: U.S. Philips Corporation, New York, N.Y.

[21] Appl. No.: 493,399

[22] Filed: May 10, 1983

[30] Foreign Application Priority Data

May 13, 1982 [AT] Austria ................... 1887/82

[51] Int. Cl.³ ............................................. G11B 21/02
[52] U.S. Cl. ................................. 360/77; 310/317
[58] Field of Search ...................... 360/77; 310/317

[56] References Cited

FOREIGN PATENT DOCUMENTS 364548 10/1981 Austria .

Primary Examiner—George G. Stellar
Attorney, Agent, or Firm—Robert T. Mayer; Bernard Franzblau

[57] ABSTRACT

A circuit arrangement for generating an actuating voltage for a piezo-electric element (1) of a positioning device intended for positioning a recording and/or reproducing head relative to an information track. A control signal whose amplitude is representative of a positional error is applied to a signal conversion stage (7) in the form of an amplitude modulator. The modulator output signal is applied to the primary (10) of a transformer (11). The piezo-electric element is connected to the secondary (12) via a bipolar switching device (13) which is actuated by a periodic pulse-shaped switching signal which, by means of a pulse-shaper stage (20), is derived from a carrier signal supplied by an oscillator (18). The switching signal corresponds in time to only one of the two peak amplitude values of the carrier signal and has a pulse width less than half the period of the carrier signal.

16 Claims, 12 Drawing Figures

CIRCUIT ARRANGEMENT FOR GENERATING AN ACTUATING SIGNAL FOR A PIEZO-ELECTRIC ELEMENT OF A POSITIONING DEVICE

The invention relates to a circuit arrangement for generating an actuating voltage for a piezo-electric element of a positioning device, which is intended in particular for positioning a recording and/or reproducing head relative to an information track. A control signal which is representative of a positional error is applied to a signal conversion stage, whose output signal is applied to the primary circuit of a transformer. The piezoelectric element is connected to the secondary circuit of said transformer via a bipolar switching device, which in its turn is actuated by a switching signal in a specific relation to the output signal of the signal conversion stage. Such a circuit arrangement is known from Austrian Patent No. 364,548.

For the deflection of a piezo-electric element used for positioning an object a comparatively high actuating voltage is required, which voltage must be derived from a control signal, which in general is to be understood to mean a signal which in some form contains information about the error in the position of the object, which error is to be eliminated by means of the positioning device. A circuit arrangement for generating such an actuating signal should generate a corresponding actuating voltage with a minimal power consumption, i.e. with a satisfactory efficiency. In the circuit arrangement known from the aforementioned AT-PS No. 364,548 a control signal, which in the present case comprises two signal components which appear simultaneously and whose mutual phase difference represents the positional error, is converted into pulses in the signal conversion stage. These pulses are applied to the primary circuit of a transformer to whose secondary the piezo-electric element is connected via a bipolar switching device, said pulses also being used as the switching signal for actuating the switching device. Thus, during the appearance of each pulse power is applied to the primary side of the transformer, which results in a primary voltage which is transformed into a correspondingly high secondary voltage, which is applied to the piezo-electric element via the switching device for the same time interval which is determined by the pulses, so that the voltage across said element varies in conformity with the control signal. The position-control information is then contained in the repetition rate and duration of the pulses. The construction of a signal conversion stage which thus converts such a control signal into pulses is comparatively complex and the transformation of the pulse-shaped signal in the transformer is not effected with a satisfactory efficiency.

It is an object of the invention to further simplify the construction of a circuit arrangement of the type mentioned in the opening paragraph and to generate the actuating voltage with a minimal power consumption, i.e. with a satisfactory efficiency. To this end the invention is characterized in that the signal conversion stage is an amplitude modulator, to which the control signal whose amplitude is representative of a positional error is applied and to which a periodic carrier signal from an oscillator is applied, which carrier signal has a higher frequency than the control signal. A periodic pulse-shaped switching signal for actuating the switching device is derived from said carrier signal by means of a pulse-shaper stage, which switching signal corresponds in time to only one of the two peak amplitude values of the carrier signal and has a pulse width smaller than half the period of the carrier signal. The conversion of the control signal whose amplitude represents a positional error into a signal for energizing the primary circuit of the transformer is thus effected by an amplitude modulator, which is of very simple construction, so that also commercially available elements can be used for this purpose. A periodic signal is applied to the primary circuit of the transformer and is transformed to the secondary with a satisfactory efficiency, the peak amplitude values of the secondary voltage then being transferred to the piezo-electric element because the switching device is actuated in synchronism with only one of the two peak amplitude values of the carrier signal. Thus, the peak amplitude values of the secondary voltage are applied in the same way as in a circuit known as a "sample-and-hold" circuit. This yields a very good overall efficiency so that only a comparatively low power is required for generating the comparatively high actuating voltage.

It is found to be very advantageous if the signal conversion stage is constructed as a suppressed-carrier amplitude-modulator. As is known, such an amplitude modulator has the property that the phase of its modulated output signal, which in principle has the carrier frequency, is inverted if the sign of the modulation signal changes relative to a reference level. In the circuit arrangement in accordance with the invention such an amplitude modulator therefore simply enables control signals of either polarity to be processed so as to deflect the piezo-electric element in two opposite directions with respect to a rest position. As a result the positioning range is doubled in comparison with a positioning element that can be deflected in one direction only. Alternatively, the same positioning range can be obtained without a constant bias of the piezo-electric element, which again would result in a loss of power.

In this respect it was also found to be advantageous for the amplitude modulator be constructed as a ring modulator. As is known a ring modulator is a special type of suppressed-carrier amplitude-modulator which has the advantage that its output signal contains a minimum of side-band frequencies and therefore follows the carrier-frequency signal in an optimum manner, which also applies to the signal appearing across the secondary of the transformer. Thus, a circuit arrangement in accordance with the invention which comprises such an amplitude modulator ensures that the sampling instants at which the voltage appearing across the secondary of the transformer is transferred to the piezo-electric element and which are determined by the switching signal, which in its turn is derived from the carrier signal, when the switching device is actuated by said switching signal, correspond very accurately to the peak amplitude values of said secondary voltage so that a particularly favourable power transfer is obtained.

Furthermore, it is found to be favourable if the transformer is tuned to parallel resonance for the frequency of the fundamental wave of the carrier signal. The resonance step-up then provides a further improvement of the power transfer.

It was also found to be very advantageous for the oscillator to supply a sinewave signal. Such a signal, which in principle comprises only one fundamental wave, leads to a very favourable power transfer in the transformer.

However, suitably the oscillator may be an oscillator which supplies a sawtooth signal. This greatly simplifies the circuit arrangement because oscillators of this type are of a very simple circuit design. However, since a sawtooth signal contains a plurality of harmonics the power transfer in the transformer is less favourable than in the case of a sinewave oscillator.

However, the power transfer can then be improved still further if the oscillator is an oscillator which supplies a symmetrical sawtooth signal. This is because such a saw-tooth signal has a very distinct fundamental wave which is transferred effectively by the transformer.

The choice of the pulse width of the switching signal for the actuation of the switching device depends on various factors. The peak amplitude values of the signal across the secondary of the transformer must be sampled as accurately as possible because they represent the instantaneous control signal, which means that the pulse width should be minimized. However, the current required for charging the piezo-electric element to the instantaneous peak amplitude value of the voltage across the secondary of the transformer increases as the pulse width decreases. Also, phase shifts between the switching signal and the output signal of the amplitude modulator, or the voltage across the secondary of the transformer, have a more unfavorable effect because it becomes more likely that the actual peak amplitude values of the secondary voltage of the transformer are no longer sampled. For an optimum compromise between these conflicting requirements, it was found to be advantageous for the pulse width of the switching signal for the actuation of the switching device to be of the order of magnitude of one tenth of the period of the carrier signal.

There are various uses, such as for example in the magnetic recording and/or reproduction of television signals, where a plurality of piezo-electric elements, each associated with a separate positioning device, must be positioned accordingly. In such as case it is obvious that a separate circuit arrangement in accordance with the invention may be provided for each of these piezo-electric elements. It is then particularly advantageous if, for generating an actuating voltage for each of at least two piezo-electric elements of a corresponding number of positioning devices, there is provided an amplitude modulator, a transformer and a switching device. It is also advantageous, for generating a carrier signal, to provide for all amplitude modulators a single oscillator, and for generating a switching signal for the actuation of all the switching devices to provide a single pulse shaper stage. The multiple use of the individual circuit elements results in a substantial simplification of the complete circuit arrangement, ensuring that the different actuating voltages for the individual piezo-electric elements are generated under substantially similar conditions because the same carrier signal and switching signal are always employed.

In such a circuit arrangement in which each switching device comprises the parallel arrangement of a transistor with a diode in series with its collector, the two transistors are of opposite conductivity types and the two diodes are poled in the forward direction relative to the relevant transistor and are connected to one end of the secondary of the transformer associated with the relevant piezo-electric element, which element is connected to the other end of said secondary, as is known from the AT-PS No. 364,548 mentioned in the introduction. It is also found to be advantageous to provide the two transistors, whose bases receive the switching signal in phase opposition, in common to all the switching devices, but then two separate diodes are provided for each of the switching devices. All diodes which are poled in the same direction are each arranged in series with the collector of the relevant transistor. This also enables a multiple use of individual elements of the switching devices, which results in a further simplification of the complete circuit arrangement.

For a simple design of the circuit arrangement it was also found to be advantageous for the switching device to be a triac whose hold current is larger than the maximum current which flows through the triac when the piezo-electric element is actuated. In this way the bipolar switching functions are obtained by means of a simple circuit element, the special mode of operation selected for the triac ensuring that its bipolar switching function is maintained only during actuation by the switching signal and does not continue until the voltage applied to it has decreased to the value zero.

For a simple circuit design it was also found to be advantageous for the switching device to be a bridge-rectifier circuit of which one diagonal is arranged between the secondary of the transformer and the piezo-electric element and the other bridge diagonal includes a transistor driven by the switching signal.

Embodiments of the invention will now be described in more detail, by way of example, with reference to the drawings.

Figure 1:
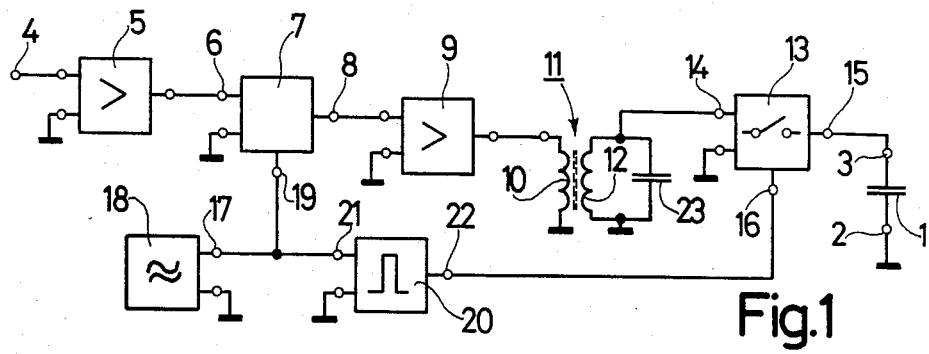
FIG. 1 is a block diagram of a circuit arrangement in accordance with the invention for generating an actuating voltage for a piezo-electric element of a positioning device.

In the block diagram shown in FIG. 1 a piezo-electric element, hereinafter referred to as piezo-element, of a positioning device is represented as a capacitance 1. Such a piezo-element may comprise for example two strip-shaped layers of a piezo-electric material whose length changes upon application of an electric field in the opposite direction, which results in a deflection of the piezo-element. These two layers are arranged on a common conductive layer and on the sides facing the latter layer electrodes are arranged which have electrical connection points designated 2 and 3 in FIG. 1. Electrically a piezo-element between said connection points 2 and 3 behaves as a capacitance. If such a piezo-element is clamped at one end and an actuating voltage is applied to the connection points 2 and 3, the element will deflect in proportion to this actuating voltage, as a result of which the free end of the piezo-element performs a translational movement and its position changes accordingly. An object arranged on this free end of the piezo-element can thus be brought into a specific position. Such an object may be a magnetic head which can then be positioned, relative to an information track, by means of the position device so as to follow this track exactly.

The actuating voltages required for such piezo-elements are comparatively high and are of the order of magnitude of 150 V. Therefore, a comparatively high power is required for generating such an actuating voltage, which may be particularly unfavourable in the case of a battery-operated apparatus. In order to solve this the circuit arrangement of FIG. 1 is provided, which is of a very simple circuit design.

The object to be brought into the desired position by means of the positioning device is adjusted by means of a control signal whose amplitude is representative of the instantaneous positional error of the object relative to its nominal position. The circuit arrangement shown in FIG. 1 converts such a control signal into a corresponding actuating signal for the piezo-element. For this purpose the control signal is applied to the input terminal 4 of the circuit arrangement from which, if required after amplification in an amplifier 5, it is transferred to the input 6 of a signal conversion stage 7. The output signal appearing at the output 8 of the signal conversion stage 7, if necessary after amplification in the amplifier 9, is applied to the primary circuit 10 of the transformer 11. By means of this transformer 11 the output signal of the signal conversion stage 7 is transformed into a correspondingly high voltage which appears across the secondary circuit 12. Within specific time intervals, this voltage across the secondary circuit 12 of the transformer 11 is transferred to the capacitance 1 of the piezo-element as the actuating voltage for this element by means of a bipolar switching device 13, whose switching path, which extends between its terminals 14 and 15 and in which current can flow in either direction, is arranged between the secondary circuit 12 and the connection point 3 of the piezo-element. The time intervals in which said voltage is to be transferred are defined by a switching signal for the actuation of the switching device 13, which signal is applied to the control input 16 of this device and then causes the impedance of the switching path of the switching device to become low for one of the two current flow directions. Thus, by means of this switching device 13 it is possible either to transfer electric charge from the secondary circuit 12 of the transformer 11 to the capacitance 1 of the piezo-element or to remove charge from said capacitance, depending on whether the voltage across the secondary 12 is higher or lower than the voltage across the capacitance of the piezo-element.

The signal conversion stage 7 in such a circuit arrangement is an amplitude modulator, the control signal applied to its input terminal 6 being the modulation signal, which in known manner is modulated on a periodic carrier signal. The carrier signal, whose frequency is customarily higher than that of the modulation signal, is applied from an output 17 of an oscillator 18 to a further input 19 of the signal conversion stage. The output signal at the output 8 of the signal conversion stage 7 is then an amplitude-modulated signal, the peak amplitude values of the carrier signal being representative of the original control signal. Via the amplifier 9 this output signal is applied to the primary circuit 10 of the transformer 11 and is transformed to the secondary circuit 12. Since the periodic carrier signal is predominant in the signal to be transformed, the transformation in the transformer 11 is effected with a very high efficiency Furthermore, a periodic pulse-shaped switching signal, which corresponds in time to only one of the two peak amplitude values of the carrier signal and whose pulse width is smaller than half the period of the carrier signal, is derived from the carrier signal via a pulse-shaper stage 20 for actuating the switching device 13. The input 21 of the pulse-shaper stage 20 is connected to the output 17 of the oscillator, the output 22 of said stage being connected to the control input 16 of the switching device 13. Since the pulse-shaped switching signal supplied by the pulse-shaper stage 20 is derived from the carrier signal and corresponds in time to a specific amplitude peak value of said carrier signal, the switching device 13 is actuated at the very instants at which the voltage across the secondary 12 of the transformer 11 also reaches an amplitude peak value in conformity with the carrier signal which is amplitude-modulated with the control signal. In this way the peak amplitude values of the voltage across the secondary 12 of the transformer, which values are always representative of the control signal, are used to influence the voltage across the capacitance of the piezo-element. As a result the deflection of the piezo-element is in conformity with the instantaneous control signal.

Preferably, the transformer is tuned to parallel resonance for the frequency of the fundamental wave of the carrier signal, which can be achieved by parallel connection of a suitable capacitor 23 to the secondary 12. Thus, in the transformation of the amplitude-modulated signal, which is based on the signal of carrier frequency, the resonance step-up for the carrier signal may be used, so that a particularly high efficiency is obtained. Since the fundamental wave of the carrier signal is then transferred with preference, the peak amplitude values of the signal across the secondary of the transformer corresponds in time to the peak amplitude values of the carrier signal with a high accuracy. As the switching signal has been derived from the carrier signal, the switching device is actuated accurately in step with the peak amplitude values of the signal across the secondary of the transformer. This also means that the peak amplitude values of the signal across the secondary of the transformer, which values are representative of the control signal, are transferred correctly to the capacitance of the piezo-element in order to deflect this element. However, it is to be noted that a capacitor 23 for tuning the resonant frequency of the transformer is not strictly necessary, but that its presence further improves the operation of the circuit arrangement.

Figure 2:
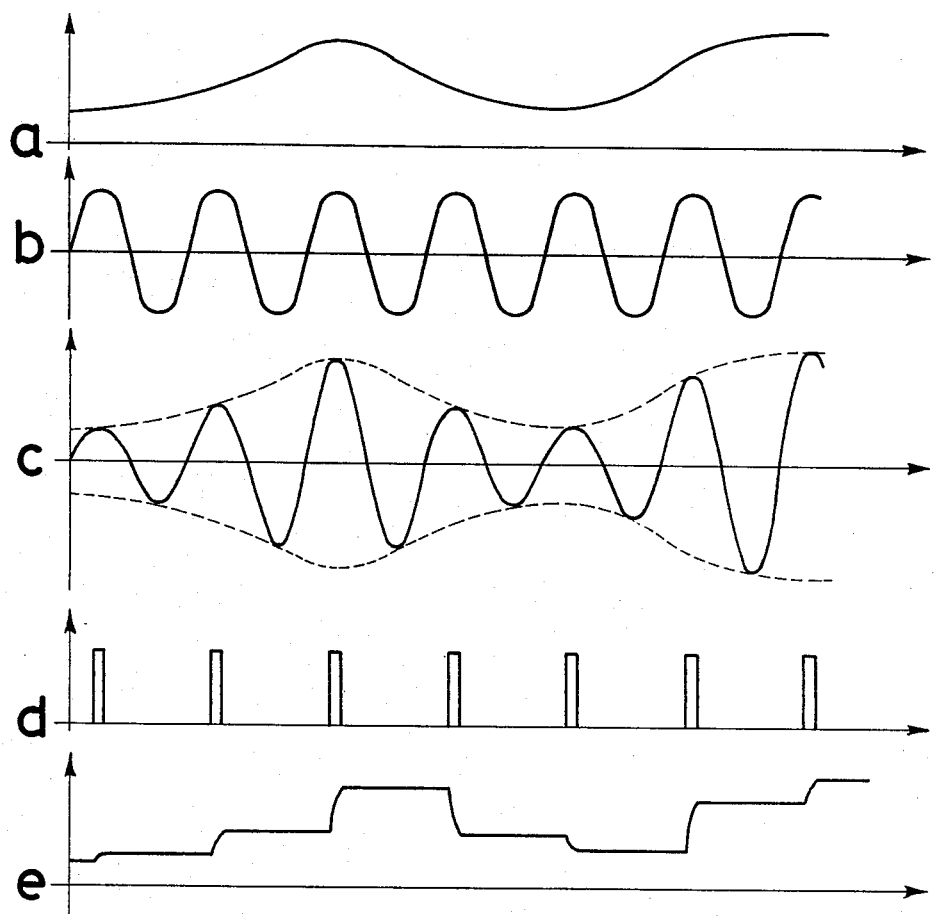
FIGS. 2a to 2e are waveform diagrams tp explain the operation of a circuit arrangement as shown in FIG. 1.

For the amplitude modulator any known circuit may be used. For example, an amplitude modulator 7 may simply comprise a non-linear circuit element to which the modulation signal and the carrier signal are applied in series and from which the modulated signal is also taken in series. The modulation signal of such an amplitude modulator may be a control signal whose sign does not change with respect to a reference level. The relevant signal waveforms are shown in the diagrams of FIG. 2. Diagram a shows the waveform of a control signal, the horizontal axis representing the reference level. Diagram b shows the carrier signal whose frequency is higher than that of the control signal. In the aforementioned example it may be assumed that the control signal comprises frequency components up to approximately 1 kHz. In such a case it is advisable that the frequency of the carrier signal be of the order of magnitude of 40 kHz. Diagram c shows the resulting amplitude-modulated signal, which forms the output signal of the signal conversion stage 7. As can be seen, the periodic carrier signal is predominant in such a signal so that this signal is transformed by the transformer 11 with a satisfactory efficiency. Diagram d shows the periodic pulse-shaped switching signal for actuating the switching device 13, which switching signal is derived from the carrier signal by a pulse-shaper stage 20 in such a way that the pulses correspond in time to ony one of the two peak amplitude values of the carrier signal, namely in the present case the positive amplitude peak values. The pulse width of the switching signal is selected so that it is approximately one tenth of the period of the carrier signal, which is found to be very effective in practice. As can be seen from the diagrams c and d the pulses of the switching signal correspond to the peak amplitude values of the modulated signal, which also appears across the secondary circuit 12 of the transformer 11, because this modulated signal in principle comprises signal components of the carrier signal, from which in turn the pulses of the switching signal are derived. Therefore, the switching device 13 is actuated by the switching signal when the modulated signal reaches its relevant peak amplitude value. The amplitude peak values of the voltage across the secondary 12 of the transformer are thus transferred to the capacitance of the piezo-element by the switching device 13 as shown in diagram e, the voltage across the piezo-element either increasing or decreasing as a result of the bipolar operation of the switching device, depending on whether the instantaneous voltage across it is smaller or greater than the amplitude peak value of the voltage across the secondary circuit 12. Thus, via the switching device 13 either a charging current will flow from the secondary 12 of the transformer 11 to the capacitance 1 of the piezo-element or a discharge current will flow in the opposite direction. In this way the actuating voltage applied to the piezo-element follows the control signal, said voltage being generated with a high efficiency and by means of a simple circuit.

Figure 3:
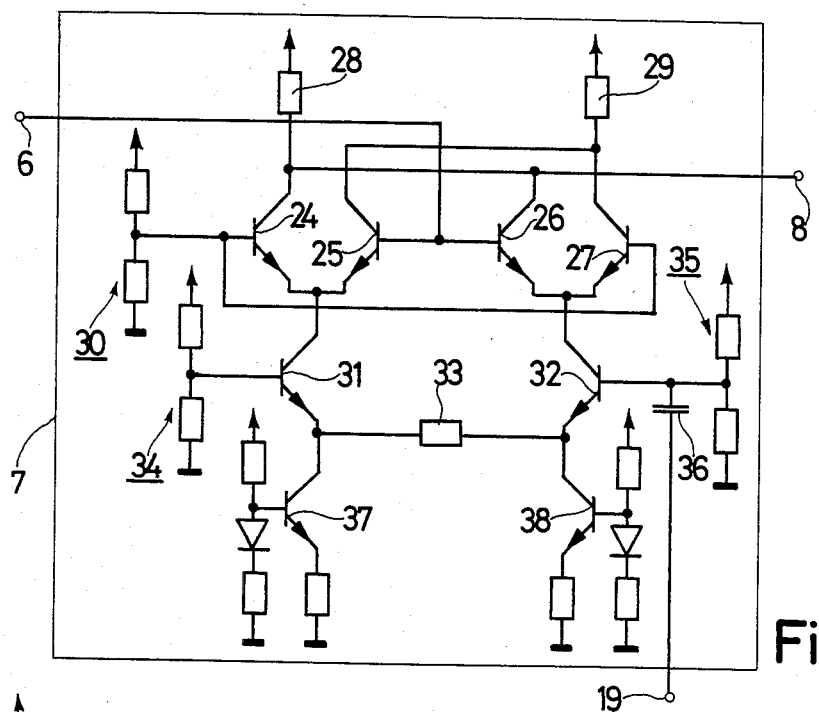
FIG. 3 shows the circuit diagram of a ring modulator which is suitable for use in a circuit arrangement as shown in FIG. 1.

Another very advantageous version of an amplitude modulator which may be used in the circuit arrangement shown in FIG. 1 is a ring modulator, whose circuit diagram is shown in FIG. 3 and which is commercially available under the type designation TCA 240. This ring modulator comprises two differential amplifiers which each comprise a pair of transistors 24, 25 and 26, 27 respectively. The emitters of these transistors are interconnected and their collectors are cross-coupled to two load resistors 28 and 29, from which the modulator output-signal can be taken. The output signal is taken from the load resistor 28 in the present case. A reference level from a voltage divider 30 is applied to the bases of the transistors 24 and 27 and the modulation signal, in the present case the control signal, from the input 6 is d.c. coupled to the bases of the transistors 25 and 26 because the control signal may comprise a d.c. component. Transistors 31 and 32 are arranged in series with the emitters of the transistors 24, 25 and 26, 27, respectively of these two differential amplifiers. The emitters of said transistors 31, 32 are coupled to each other via a resistor 33 so that these two transistors operate as a further differential amplifier. The bases of the transistors 31 and 32 are connected to further voltage dividers 34 and 35 respectively for adjusting their operating points. The carrier signal from the further input 19 is applied to the base of the transistor 32 via capacitor 36. Moreover, current-source transistors, 37 and 38 are arranged in series with the emitters of the two transistors 31 and 32, respectively.

In such a circuit arrangement the carrier signal appears in phase opposition at the collectors of the transistors 31 and 32, which is then alternately modulated with opposite phase by the modulation signal in the transistors 24, 25 and 26, 27 of the two differential amplifiers. In this way an amplitude-modulated signal appears at the output 8 of the ring modulator, which signal essentially comprises only two components, namely the sum signal and the difference signal of the carrier signal and the modulation signal, the carrier signal itself being suppressed. As is known, such a modulated signal has the property that its phase is inverted when the sign of the modulation signal changes relative to a reference level. This has the advantage that the ring modulator can process a control signal whose polarity changes relative to a reference level, depending on whether a positional error occurs in one or the other direction relative to a rest position of the piezo-element, so that the piezo-element can be positioned in either direction.

Figure 4:
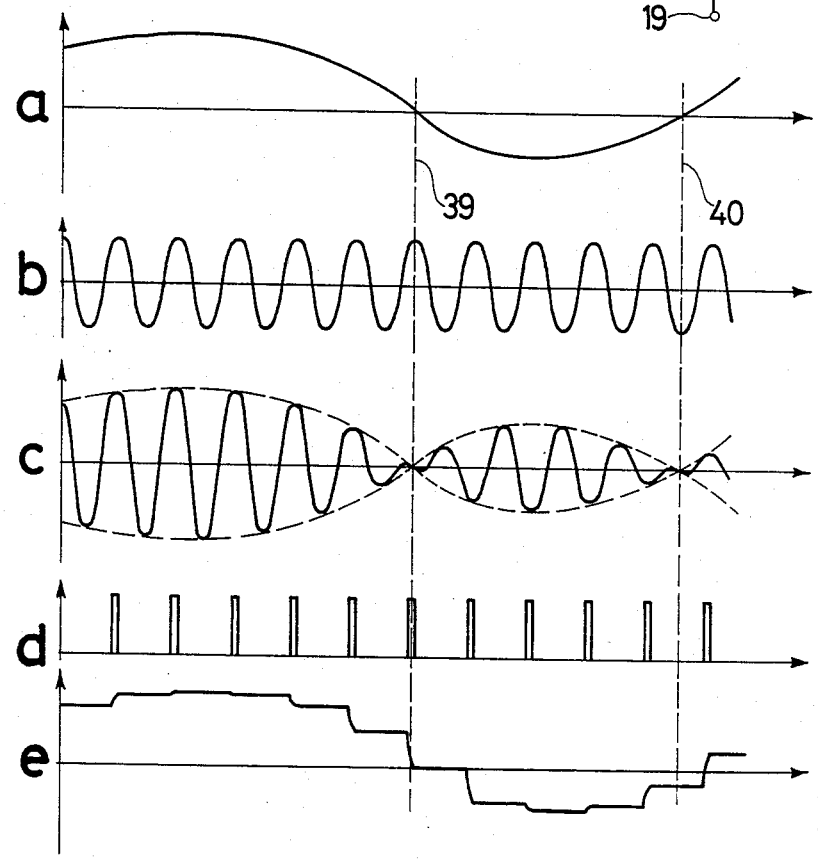
FIGS. 4a to 4e are waveform diagrams to explain the operation of a circuit arrangement as shown in FIG. 1, comprising a ring modulator as shown in FIG. 3.

The relevant signal waveforms are shown in the diagrams of FIG. 4. Diagram a shows the waveform of the control signal, the horizontal axis forming the reference level. A control signal is shown which initially has a positive amplitude, then a negative amplitude and again a positive amplitude. Diagram b shows the carrier signal and diagram c the amplitude-modulated signal with suppressed carrier. The ordinates 39 and 40 represent the instants at which the sign of the control signal changes, diagram c showing that at these points the phase of the modulated signal changes. Diagram d shows the periodic pulse-shaped switching signal which is applied to the switching device 13 and which is again derived from the carrier signal by the pulse-shaper stage 20 in such a way that its pulses correspond in time to only one of the two peak amplitude values of the carrier signal, in the present case the positive peak amplitude values. In this way it is again achieved that the pulses of the switching signal appear at instants which correspond to the peak amplitude values of the modulated signal because this largely follows the carrier signal. However, since upon a change of the sign of the control signal the phase of the modulated signal changes, this means that in the case of such a change of phase the pulses of the switching signal appear at instants which correspond to the peak amplitude values of opposite sign of the modulated signal, as can be seen by comparing the diagrams c and d. In the circuit arrangement shown in FIG. 1 this means that the sign of the voltage across the capacitance of the piezo-element can also change, depending on the control signal, as can be seen in diagram e. Thus positional errors in two directions relative to a rest position of the piezo-element can be compensated for.

Some further embodiments of the circuit arrangement shown in FIG. 1 will now be described hereinafter.

Figure 5:
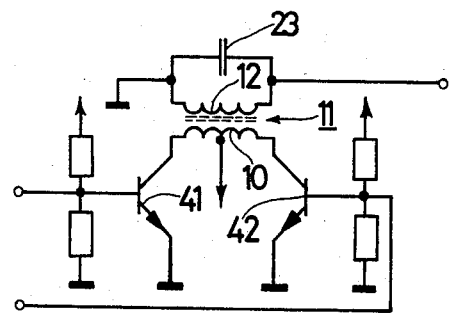
FIG. 5 shows a part of the circuit arrangement in which the transformer is a push-pull transformer.

FIG. 5 shows a version of the transformer 11 which functions as a push-pull transformer with respect to its primary circuit 10, which in the present case is energized in phase opposition at the collector side of two transistors 41, 42. Consequently the output signal of the amplitude modulator must be applied to the bases of the two transistors 41, 42 in phase opposition, which is simply possible in the case of a ring modulator as shown in FIG. 3 in that the second signal of opposite phase is taken from the load resistor 29.

Figure 6:
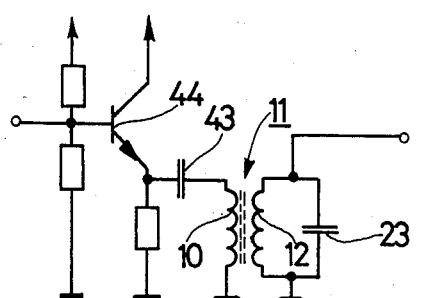
FIG. 6 shows a part of the circuit arrangement in which the transformer is energized from a low-impedance source.

The primary of the transformer 11 may be energized either from a high-impedance source or from a low-impedance source. The first-mentioned case occurs if the primary circuit of the transformer is for example energized from the collector of a transistor. Energisation from a low-impedance source is effected in the circuit arrangement shown in FIG. 6 in which the primary circuit 10 of the transformer 11 is connected to the emitter of a transistor via a capacitor 43. The amplitude-modulated signal is applied to the base of said transistor. If the transformer 11 is tuned to parallel resonance at the frequency of the fundamental wave of the carrier signal by means of a capacitor 23, the two methods of energization of the transformer described in the foregoing have different advantages, depending on the circuit design. In the case of energization from a high-impedance source the power consumption is lower but deviations from the tuning as a result of tolerances of the circuit elements are greater because phase differences between the switching signal and the signal across the secondary of the transformer may occur. As a result the actual amplitude peak values of the last-mentioned signal are no longer sampled so that the actuating signal for the piezo-element is no longer perfectly proportional to the control signal. Therefore, this method will be adopted if resonance tuning is possible in a simple manner. Energization from a low-impedance source requires more power, but the deviations from the resonance tuning are smaller because the phase difference between the two aforementioned signals are smaller. Such a method is therefore selected if resonance tuning is not readily possible.

Figure 7:
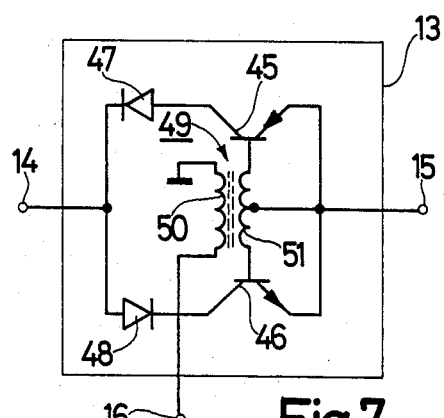
FIG. 7 shows a version of a bipolar switching device comprising two transistors and two diodes.

FIG. 7 shows a circuit diagram of a switching device 13. It comprises the parallel arrangement of the transistors 45 and 46 with the diodes 47 and 48 arranged in series with this respective collectors. The two transistors 45, 46 are of opposite conductivity types and the diodes 48, 47 are poled in the forward direction relative to the relevant transistors 45 or 46. This parallel arrangement, which is connected to the terminal 14 and to the terminal 15 of the bipolar switching device 13, constitutes its switching path. The switching signal from the control input 16 is applied to the bases of the two transistors 45 and 46 in phase opposition, for which purpose there is provided a transformer 49 whose primary circuit 50 is connected to the control input 16 and whose secondary circuit 51 is arranged as a push-pull winding. The centre tap of winding 51 is connected to the emitters of the two transistors 45 and 46 and the coil terminations are connected to the bases of the transistors 45 and 46 respectively. In this way the switching signal can turn on the transistors 45 and 46 in order, that transistor being driven into conduction which is poled in the forward direction for the polarity of the voltage across the terminals 14 and 15, the other transistor remaining cut-off. The diodes 47 and 48 serve for voltage protection of the relevant transistor 45 or 46 when that transistor is in the cut-off state. In this way current flow in either direction is possible via the switching device 13, one of the two transistors 45 and 46 being always cut off.

Figure 8:
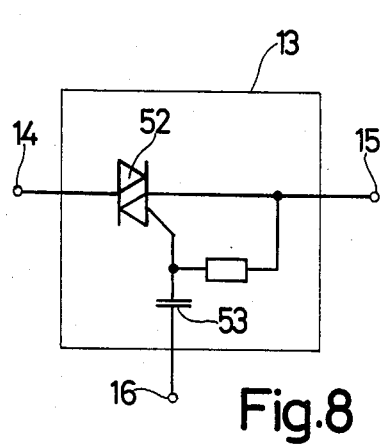
FIG. 8 shows a version of a bipolar switching device employing a triac.

FIG. 8 shows a very simple circuit for a switching device 13 comprising a triac 52 connected between the terminals 14 and 15 of the switching device and whose control electrode receives the switching signal from the control input 16 via a capacitor 53. The triac is operated in such a way that its hold current is larger than the maximum current which flows through it when the piezo-element is actuated, which ensures that its bipolar switching function is only maintained when it is actuated by the switching signal and does not continue until the voltage applied to it has decreased to the value zero.

Figure 9:
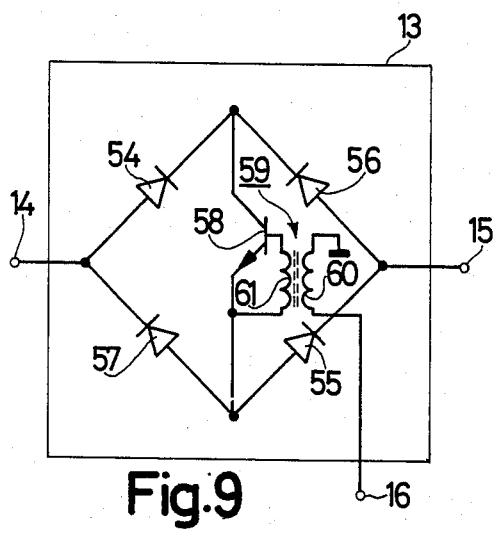
FIG. 9 shows a version of a bipolar switching device arranged as a bridge-rectifier circuit.

In the circuit arrangement shown in FIG. 9 the switching device 13 comprises a bridge-rectifier circuit 54, 55, 56 and 57, in which one bridge diagonal is arranged between the terminals 14 and 15 of the switching device. The other bridge diagonal, includes a transistor 58 which is driven by the switching signal. The switching signal is applied to the base of the transistor 58 via a transformer 59 whose primary circuit 60 is connected to the control input 16 and whose secondary circuit 61 is connected to the base-emitter junction of the transistor 58. When transistor 58 is turned on by the switching signal, current flow between the terminals 14 and 15 is possible in either of the two directions via the bridge branches 54 and 55 or 56 and 57.

Figure 10:
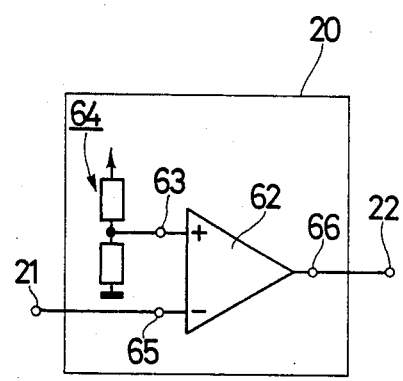
FIG. 10 shows a version of a pulse-shaper stage operating as a threshold device.
Figure 11:
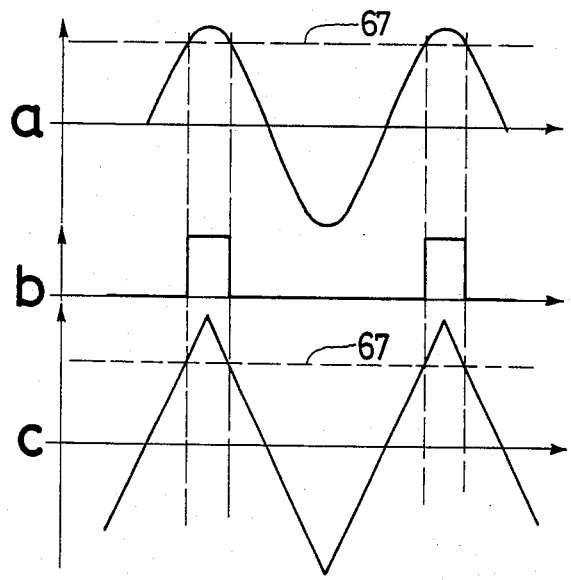
FIGS. 11a to 11c show waveform diagrams to explain the operation of a pulse shaper stage as shown in FIG. 10.

FIG. 10 shows a circuit diagram of a pulse shaper stage 20 which takes the form of a threshold device. It comprises an operational amplifier 62, to whose input 63 a threshold voltage from a voltage divider 64 is applied. The other input 65 of the operational amplifier is connected to the input terminal 21 of the pulse-shaper stage 20 to which the carrier signal is applied. The output 66 of the operational amplifier is connected to the output terminal 22 of the pulse-shaper stage. Thus, pulses are generated, in known manner, which pulses appear when the signal applied to the input 65 of the operational amplifier exceeds the threshold voltage defined by the voltage divider 64 and applied to the other input 63 of the operational amplifier. The relevant signal waveforms are shown in the diagrams of FIG. 11. Diagram a shows the carrier signal, the broken line 67 representing the threshold level. It is assumed that the carrier signal is a sinewave signal which in the present case is particularly suitable. The carrier signal is particularly suitable for transformation in the transformer 11 during further processing in the circuit arrangement shown in FIG. 1 since it comprises only one fundamental wave. Diagram b shows the pulses obtained by means of the pulse-shaper stage 20, which pulses correspond in time to only one of the two peak amplitude values of the carrier signal and have a pulse width which depends on the selected threshold level, so that this pulse width can be chosen in a very simple manner. In the present case the pulse width is selected to be comparatively small so that the pulse substantially coincide with the actual peak amplitude values of the carrier signal, yet large enough that these amplitude peak values are also processed in the case of deviations of the peak amplitude values from the specified carrier signal waveform. Diagram c shows a carrier signal having a symmetrical sawtooth waveform and shows that the desired switching signal can again be derived from such a carrier signal by means of the pulse-shaper stage described in the the foregoing. Such a carrier signal, which can be generated by means of a simple oscillator, is also particularly suitable for processing in the circuit arrangement shown in FIG. 1 because it comprises a distinct fundamental wave which can be transformed with good efficiency in the transformer 11, in particular if the transformer is tuned to parallel resonance for said fundamental wave. However, in principle asymmetrical sawtooth waveforms also may be employed as carrier signals. It is obvious that various other possibilities may be adopted for a pulse-shaper stage which generates pulses which are in a specific relationship to another signal, as in the present case.

Figure 12:
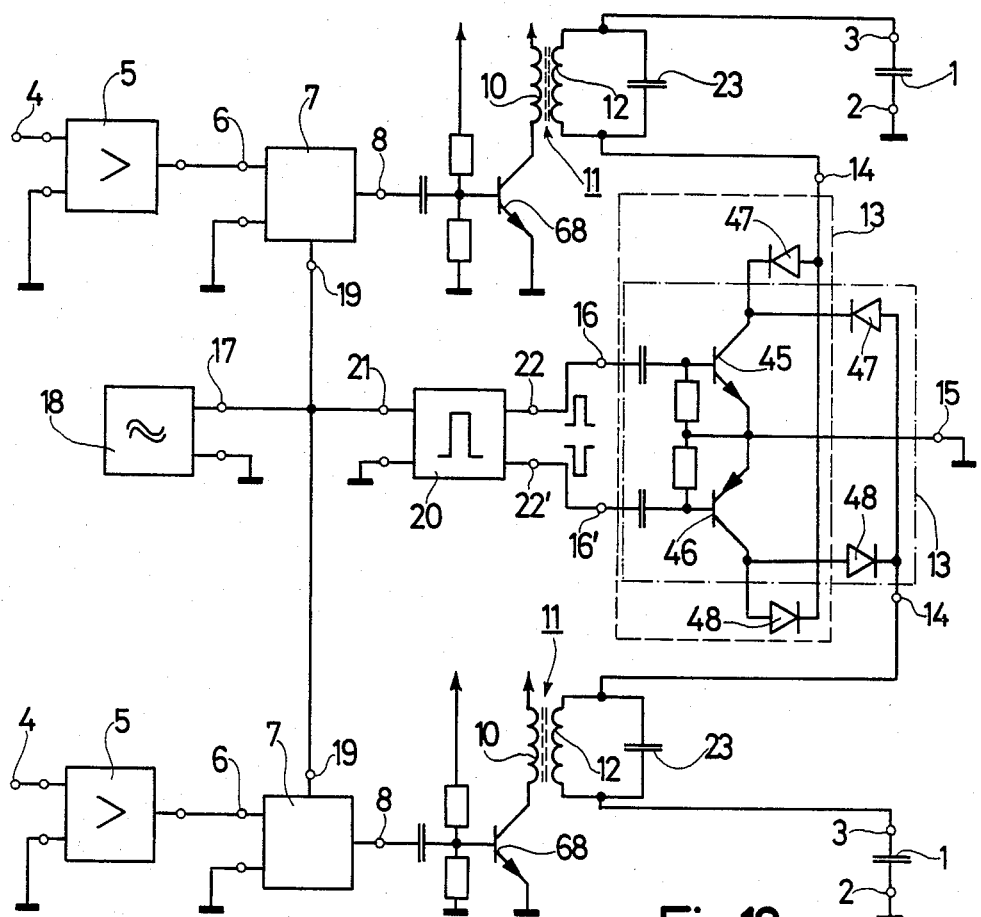
FIG. 12 shows a circuit arrangement for generating an actuating voltage for two piezo-electric elements which each belong to one positioning device.

In the embodiment shown in FIG. 12 an actuating voltage is generated for two piezo-elements which each belong to a positioning device, several of the required circuit elements being utilised twice so that the circuit arrangement is simplified. Each of the two piezo-elements, which are again represented by a capacitance 1, is used in combination with an amplitude modulator 7 forming the signal conversion stage, a transformer 11 and a switching device 13. For generating a carrier signal one oscillator 18 is used for both of the amplitude modulators and for generating a switching signal for actuating the two switching devices 13 one pulse shaper stage 20 is used. The separate control signals for each piezo-element are again to be applied to input terminals 4, the control signals being applied to the corresponding amplitude modulator 7 as modulation signals via amplifiers 5. From the output 17 of the single oscillator 18 the carrier signal is applied to the inputs 19 of the two amplitude modulators 7. The output signals appearing at the output terminals 8 of the amplitude modulators 7 are each amplified in a transistor 68, whose collector energizes the primary circuit 10 of the transformer 11 associated with the relevant piezo-element. The connection points 3 of the piezo-elements are connected directly to one end of the secondary circuit 12 of the transformer 11 and their connection points 2 are connected to reference potential. The terminals 14 of the switching device 13 are connected to the other end of the secondary circuit 12 of the relevant transformer 11 and the terminals 15 are connected to reference potential so that electrically they are arranged between the secondary circuits 12 of the transformers 11 and the piezo-elements. Since the switching devices 13 are connected to reference potential at one side, the application of the switching signals is simpler because a transformer is not required. The switching signals for actuating the two switching devices 13 are generated in a single pulse-shaper stage 20 whose input 21 is also connected to the output 17 of the oscillator 18. The pulse-shaper stage 20 comprises two outputs 22 and 22', at which the pulse-shaped switching signal is available in phase opposition. The switching devices 13 are similar to the version shown in FIG. 7, a switching device comprising the parallel arrangement of a transistor 45 or 46 with a diode 47 or 48 arranged in series with its collector. The transistors 45, 46 are of opposite conductivity types and the two diodes 47, 48 are poled in the forward direction relative to the relevant transistor 45 or 46 and are connected to one end of the secondary circuit 12 of the transformer 11 associated with the relevant piezo-element, the other end of said secondary being connected to said piezo-element. In addition, the two transistors 45 and 46, to whose bases the switching signal is applied in phase opposition from the outputs 22 and 22' of the pulse-shaper stage 20, are common to the two switching devices 13, whereas the two diodes 47 and 48 are provided separately for the two switching devices 13, the two equally poled diodes of the four diodes 47 and 48 being arranged in series with the collector of relevant transistor 45 or 46. In this way the two transistors 45 and 46 may be common to the two switching devices 13 so that only the two diodes need be provided separately for the two switching devices, which again results in a simplified circuit arrangement.

The operation of such a circuit arrangement for generating two actuating voltages for two piezo-elements is similar to the circuit arrangement described with reference to FIG. 1. In a similar way such a circuit arrangement may be extended for the generation of more than two actuating voltages for more than two piezo-elements associated with a corresponding number of positioning devices.

As is evident from the foregoing, a number of modifications to the embodiments described are possible without departing from the scope of the invention, in particular as to the design of the amplitude modulators, but also for the other circuit sections.

What is claimed is:

1. A circuit arrangement for generating an actuating voltage for a piezo-electric element of a positioning device, said circuit arrangement comprising, means for applying a control signal which is representative of a positional error to a signal conversion stage, means for supplying an output signal of the signal conversion stage to the primary circuit of a transformer, means coupling the piezo-electric element to a secondary circuit of said transformer via a bipolar switching device, means for actuating the bipolar switching device by a switching signal having a specific relation to the output signal of the signal conversion stage, characterized in that the signal conversion stage comprises an amplitude modulator to which the control signal is applied, an oscillator for applying a periodic carrier signal to said amplitude modulator, said carrier signal having a higher frequency than the control signal, and a pulse-shaper stage responsive to said carrier signal for developing a periodic pulse-shaped switching signal for actuating the switching device, said switching signal corresponding in time to only one of two peak amplitude values of the carrier signal and having a pulse width less than half the period of the carrier signal.

2. A circuit arrangement as claimed in claim 1, wherein the signal conversion stage comprises a suppressed-carrier amplitude-modulator.

3. A circuit arrangement as claimed in claim 2, wherein the amplitude modulator comprises a ring modulator.

4. A circuit arrangement as claimed in claim 1 including means for tuning the transformer to parallel resonance at the frequency of the fundamental wave of the carrier signal.

5. A circuit arrangement as claimed in claim 1, characterized in that the oscillator supplies a sinewave signal.

6. A circuit arrangement as claimed in claim 1, characterized in that the oscillator supplies a sawtooth signal.

7. A circuit arrangement as claimed in claim 6, characterized in that the oscillator supplies a symmetrical sawtooth signal.

8. A circuit arrangement as claimed in claim 1, wherein the pulse width of the switching signal for actuating the switching device is of the order of magnitude of one tenth of the period of the carrier signal.

9. A circuit arrangement as claimed in claim 1, characterized in that for generating an actuating voltage for each of at least two piezo-electric elements of a corresponding number of positioning devices there is provided an amplitude modulator, a transformer and a switching device and for generating a carrier signal for all of the amplitude modulators there is provided a single oscillator and for generating a switching signal for the actuation of all of the switching devices there is provided a single pulse-shaper stage.

10. A circuit arrangement as claimed in claim 9 wherein each switching device comprises the parallel arrangement of two transistors each with a diode in series with its collector, the two transistors being of opposite conductivity types and the two diodes being poled in the forward direction relative to the relevant transistor and being connected to one end of the secondary of the transformer associated with a relevant piezo-electric element, said piezo-electric element being connected to the other end of said secondary, characterized in that the two transistors have bases which receive the switching signal in phase opposition and the two transistors are common to all of the switching devices, and two separate diodes are provided for each of the switching devices, all diodes which are poled in the same direction each being arranged in series with the collector of the relevant transistor.

11. A circuit arrangement as claimed in claim 1 wherein the switching device includes a triac whose hold current is larger than the maximum current which flows through the triac when the piezo-electric element is actuated.

12. A circuit arrangement as claimed in claim 1 wherein the switching device includes a bridge-rectifier circuit having one diagonal arranged between the secondary of the transformer and the piezo-electric element and whose other bridge diagonal includes a transistor driven by the switching signal.

13. A circuit for generating an actuating voltage for a piezo-electric element of a positioning device which positions a recording or reproducing head in relation to an information track comprising: means for applying a control signal representative of a positional error to an amplitude modulator stage, means for supplying an output signal of the modulator stage to a primary circuit of a transformer, means coupling the piezo-electric element to a secondary circuit of said transformer via a bipolar switching device, means for actuating the bipolar switching device with a switching signal having a specific relation to the output signal of the modulator stage, an oscillator for applying a periodic carrier signal to said amplitude modulator stage, said carrier signal having a higher frequency than the control signal, and a pulse-shaper stage responsive to said carrier signal for actuating the switching device with a periodic pulse-shaped switching signal that corresponds in time to only one of two peak amplitude values of the carrier signal and has a pulse width less than half of the period of the carrier signal.

14. A circuit as claimed in claim 13 for generating an actuating voltage for a second positioning device with a second piezo-electric element, said circuit further comprising: a second amplitude modulator stage having an input for receiving a control signal representative of a positional error, means for coupling an output signal of the second modulator stage to a primary circuit of a second transformer, second means for coupling the second piezo-electric element to a secondary circuit of the second transformer via a second bipolar switching device, and means for applying the periodic carrier signal of said oscillator to the second modulator stage and the periodic pulse-shaped switching signal of said pulse-shaper stage to the second switching device to actuate said second switching device.

15. A circuit as claimed in claim 13 further comprising a capacitor coupled to the transformer so as to tune the transformer to parallel resonance at the fundamental frequency of the oscillator carrier signal.

16. A circuit as claimed in claim 13 wherein the amplitude modulator comprises a suppressed carrier amplitude modulator.

* * * * *